(12) United States Patent
Hellmark

(10) Patent No.: US 6,504,863 B1
(45) Date of Patent: Jan. 7, 2003

(54) METHOD AND APPARATUS FOR ADAPTIVE BIT RESOLUTION IN A DIGITAL RECEIVER AND DIGITAL TRANSMITTER

(75) Inventor: L. Martin Hellmark, Lund (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 09/391,336

(22) Filed: Sep. 7, 1999

(51) Int. Cl.$^7$ .................................. H04B 1/38
(52) U.S. Cl. .................. 375/219; 375/245; 341/139; 341/145; 341/156
(58) Field of Search ................... 375/219, 245, 375/345, 346, 350; 341/51, 132, 139, 145, 144, 155, 156, 169, 152, 200; 455/574, 575, 134, 135, 136, 138, 226.2, 226.3, 226.4

(56) References Cited

U.S. PATENT DOCUMENTS

| | | | |
|---|---|---|---|
| 3,931,596 A | * 1/1976 | Gersho et al. | 341/143 |
| 4,831,382 A | * 5/1989 | Debus et al. | 341/118 |
| 5,704,351 A | 1/1998 | Mortara et al. | |
| 5,790,061 A | * 8/1998 | Norimatsu | 341/120 |
| 6,236,674 B1 | * 5/2001 | Morelli et al. | 375/219 |

FOREIGN PATENT DOCUMENTS

| | | |
|---|---|---|
| EP | 536 429 | 9/1991 |
| EP | 0658976 A | 6/1995 |
| EP | 0757446 A | 2/1997 |

OTHER PUBLICATIONS

Lakshmikumar, Kadaba R., et al., "A Baseband Codec for Digital Cellular Telephony"8107 IEEE Journal of SolidState Circuits 26(1991) Dec., No. 12, New York, US.

Proakis, John G.: "Digital Communications", McGraw–Hill, Chapters 3 and 4, pp. 113–118, 1995.

Northrop, Robert B.: "Analog Electronic Circuits Analysis and Applications", Addison–Wesley Publishing Company, pp. 464–469, 1990.

EP 536 429, english abstract.

* cited by examiner

Primary Examiner—Chi Pham
Assistant Examiner—Khanh Cong Tran
(74) Attorney, Agent, or Firm—Burns, Doane, Swecker & Mathis, L.L.P.

(57) ABSTRACT

A transceiver includes a receiver and a transmitter. The receiver includes an analog-to-digital conversion device for converting a received analog signal to digital form, and the transmitter includes a digital-to-analog conversion device for converting a digital signal into analog form for transmission. A selector selects the resolutions of the conversion devices. The resolution of the analog-to-digital conversion device is selected based on a received signal quality, e.g., the signal-to-noise ratio or the signal-to interference ratio. The resolution of the digital-to-analog conversion device is selected based on a crest factor of the transmitted signal, the crest factor depending, e.g., on the modulation format of the signal being transmitted. The higher the crest factor, the higher the resolution selected.

17 Claims, 9 Drawing Sheets

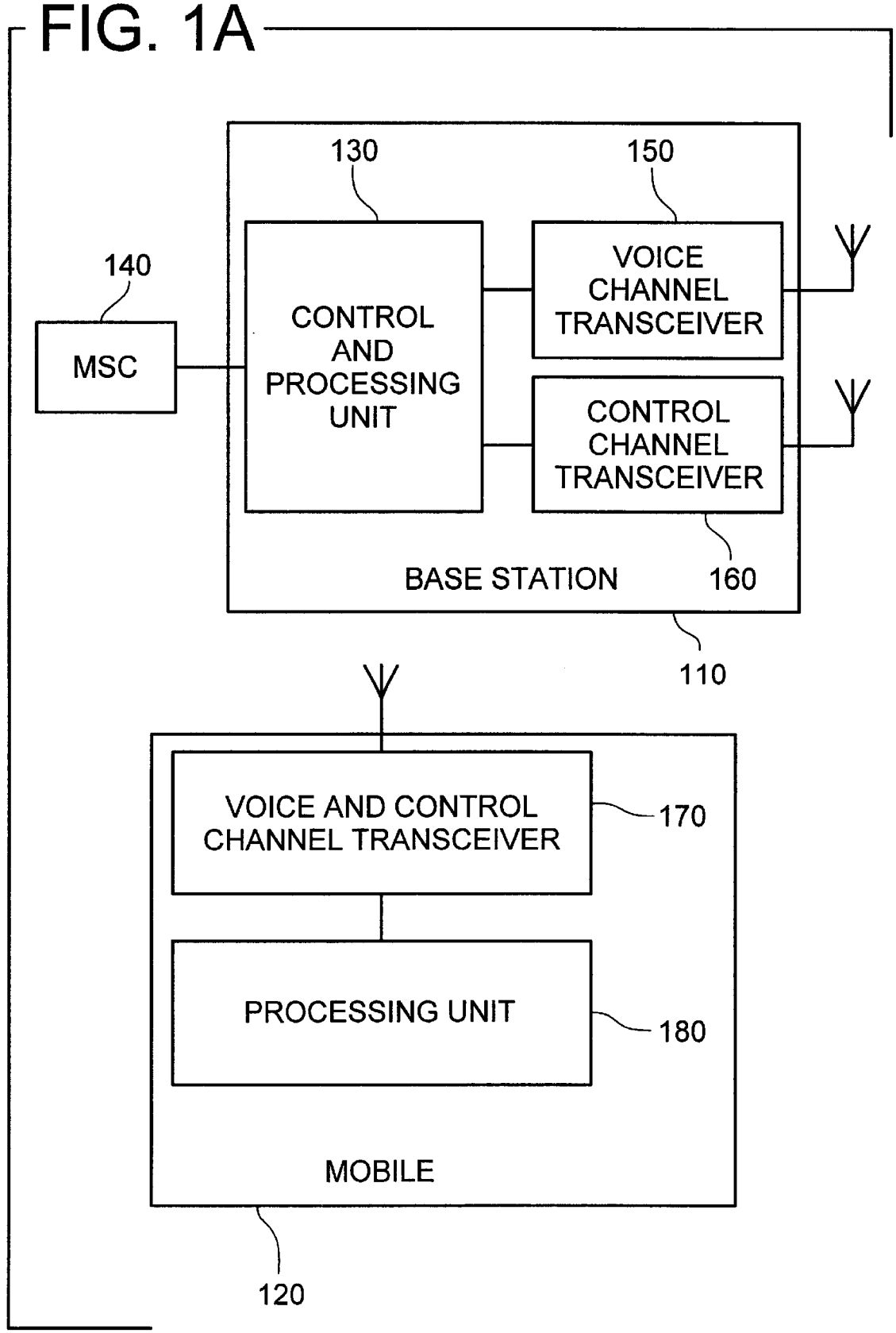

METHOD AND APPARATUS FOR ADAPTIVE BIT RESOLUTION IN A DIGITAL RECEIVER AND DIGITAL TRANSMITTER

BACKGROUND

This invention relates to a method and apparatus for adaptive bit resolution. More particularly, this invention relates to a method and apparatus for adaptive bit resolution in a digital receiver and/or a digital transmitter.

Modern communication systems, such as cellular and satellite radio systems, employ various modes of operation (analog, digital, dual mode, etc.), and access techniques such as frequency division multiple access (FDMA), time division multiple access (TDMA), code division multiple access (CDMA), and hybrids of these techniques.

In a FDMA system, each channel is assigned a specific frequency. In a TDMA system, each channel is assigned a specific time slot in a periodic train of time intervals over the same frequency. Each period of time slots is called a frame. In a CDMA system, different users, base stations (BS), and services are separated from each other with unique spreading sequences/codes.

FIG. 1A is a block diagram of an exemplary cellular mobile radiotelephone system, including an exemplary base station 110 and mobile station 120. The base station includes a control and processing unit 130 which is connected to a mobile switching center (MSC) 140 which in turn is connected to the public switched telephone network (PSTN) (not shown). General aspects of such cellular radiotelephone systems are known in the art. The base station 110 handles a plurality of voice channels through a voice channel transceiver 150, which is controlled by the control and processing unit 130. Also, each base station includes a control channel transceiver 160, which may be capable of handling more than one control channel. The control channel transceiver 160 is controlled by the control and processing unit 130. The control channel transceiver 160 broadcasts control information over the control channel of the base station or cell to mobiles locked to that control channel. It will be understood that the transceivers 150 and 160 can be implemented as a single device, like the voice and control transceiver 170, for use with control and traffic channels that share the same radio carrier.

The mobile station 120 receives the information broadcast on a control channel at its voice and control channel transceiver 170. Then, the processing unit 180 evaluates the received control channel information, which includes the characteristics of cells that are candidates for the mobile station to lock on to, and determines on which cell the mobile should lock.

In a typical digital cellular transceiver, e.g., a mobile station, a received analog waveform signal is digitized in an analog to digital converter (ADC), and an analog waveform for transmission is generated from a digital signal using a digital to analog converter (DAC).

FIG. 1B illustrates a conventional receiver which may be included, for example, in the transceiver 170. The receiver depicted in FIG. 1B is shown in a simplified form for ease of understanding. It will be appreciated that a conventional receiver can comprise additional elements which are not shown or described. The receiver shown in FIG. 1B includes a frequency selective filter 172 (representing the total selectivity in the receiver), having a bandwidth B, and an ADC 174. A received signal is filtered through the filter 172 to, among other things, remove interfering signals, resulting in a signal $x(t)=s(t)+n_{in}(t)$, where s(t) represents the wanted input signal, and $n_{in}(t)$ represents noise. The signal x(t) is converted to digital form in the ADC 174 which includes a Sampler 176 and a Quantizer 178. The Sampler 176 converts the time-continuous portion of the signal into a time-discrete form, depending on a sample clock frequency, and the Quantizer 178 converts the amplitude-continuous portion of the signal into an amplitude-discrete signal by quantizing the amplitude domain into a fine number of fixed distinguishable levels, each a distance Q apart. The process of quantizing is irreversible, since, regardless of how small the quantization level Q, an unresolvable uncertainty of ±Q/2 is associated with each quantized amplitude value. Thus, a quantization noise is inevitably associated with all quantized signals.

The receiver ADC bit resolution is determined at least partially by how much deterioration of the input signal is acceptable, e.g., by the signal to noise ratio (SNR) or signal to interference ratio (SIR) in the output signal that results in a certain desired bit error rate (BER). For convenience, the abbreviation SNR is used in the following description to represent either thermal noise or interference noise. Referring to FIG. 1B, the SNR of the filtered input signal x(t) is SNRin, the SNR of the ADC is SNRadc, and the SNR of the resulting digital signal is SNRtotadc.

FIG. 2 illustrates signal and noise levels in the receiver. In FIG. 2, $Pn_{in}$ is the power of the input noise signal $n_{in}(t)$, Ps is the power of the input signal s(t), Dqadc is the the quantization noise power of the ADC, Pntot is the total noise input power, i.e., $Pn_{in}$+Dqadc, and Px is the power of the filtered signal x(t). Also shown in FIG. 2 are the SNRin, the SNRadc, and the SNRtotadc. From FIG. 2, it can be seen that SNRin is the ratio Ps/Pnin, SNRadc is the ratio Px/Dqadc, and SNRtotadc is the ratio Ps/Pntot. All of these values may be given in decibels (dB).

Note that, in this example, SNRin and SNRtot are negative. In all examples, it is assumed that the minimum SNR to provide an acceptable BER is negative. This is a normal situation in CDMA receivers, in which despreading of the received signal, after the analog-to-digital conversion, increases the SNR by a factor of the processing gain (PG).

The minimum SNR of the signal converted by the ADC (SNRadcmin) which results in a minimum acceptable SNRtotadcmin for a certain performance (BER) can be described by the following equation:

$$SNR_{adcmin} = 10 \log\left\{\frac{10^{\frac{SNRin}{10}} + 1}{10^{\frac{SNRin - SNRtotadcmin}{10}} - 1}\right\} \quad (1)$$

For a large negative SNRin, i.e., for an input signal that is basically Gaussian noise, Equation 1 can be simplified as follows:

$$SNR_{adcmin} = 10 \log\left\{\frac{1}{10^{\frac{\Delta}{10}} - 1}\right\} \quad (2)$$

where Δ is a degradation of the SNRin, i.e., Δ=SNRin−SNRtotadcmin.

The SNRadc due to quantization of a discrete signal x(k) can be calculated by the following expression:

$$SNRadc = \frac{\sigma_x^2}{Dq_{adc}} \quad (3)$$

where:

$$Dq_{adc} = \sum_{i=1}^{M} \int_{x_{i-1}}^{x_i} (x - m_i)^2 \cdot p(x) dx \quad (4)$$

and where $\sigma_x^2$ is the power of the signal x(t), M is the number of quantization levels in the ADC (M=$2^r$, r=number of bits), $m_i$ is the quantized level, $x_i$ is the decision level (wherein if $x_{i-1}$, <x(k) <$x_i$ then x(k) can be approximated with $m_i$), and p(x) is the probability density function for the input signal and can either be approximated by a Gaussian distribution (which is normally the case in a CDMA receiver): X∈ N(0, σ), or the distribution can be continuously estimated.

Table 1 shows exemplary values for SNRadc and corresponding bit resolutions which result in optimum uniform quantization of a Gaussian signal. This is described in by John G. Proakis, *Digital Communications*, p. 116 (3rd ed. 1995).

TABLE 1

| Number of bits per sample | SNRadc [dB] |
| --- | --- |
| 1 | 4.4 |
| 2 | 9.25 |
| 3 | 14.27 |
| 4 | 19.38 |
| 5 | 24.57 |
| 6 | 29.83 |

For uniform quantization and a "large" number of quantization levels, Equation 4 can be approximated as follows:

$$Dq_{adc} = \frac{\Delta_q^2}{12} \quad (5)$$

where $\Delta_q$ is the quantization step size, i.e., $\Delta_q = x_i - x_{i-1}$.

The required SNRadcmin and the allowed degradation Δ of SNRin according to Equation 2 are plotted in FIG. 3. For example, from FIG. 3, it can be seen that a minimum of 16 dB SNRadc is required if 0.1 dB degradation of the SNRin is acceptable. Based on Table 1, this requires a four bit resolution in the quantizer.

The SNRadc and the SNRin which result in a SNRtotadc of −6 dB (for a BER of $10^{-3}$, an Eb/No of −3 dB at 1024 ksps, and a bandwidth B of 4.1 MHZ) are plotted in FIG. 4A, according to Equation 1. In FIG. 4A, the SNRadc is plotted for 1 to 6 bit quantization, according to Table 1.

The resolution of an ADC has traditionally been determined by the worst case scenario, i.e., where the power of the wanted input signal s(t) is low, resulting in a low SNRin. The resolution is set so that the quantization noise power $Dq_{adc}$ is much lower than the power of the thermal noise Pn.

For example, assume that SNRin=9 dB is the minimum SNR (SNRmin) which results in a certain BER. Then, to not degrade performance more than 0.1 dB, the SNRadcmin must be 16 dB (from FIG. 3)+9 dB=25 dB. To achieve an SNRadc of 25 dB, then referring to Table 1, the bit resolution of the ADC must be at least 5 bits. This will result in an SNRtotadc of approximately 9 dB. This can be seen with reference to FIG. 4B which shows SNRadc in relation to SNRtotadc.

Now assume that the power of the input signal s(t) is high, resulting in a high SNRin. As shown in FIG. 4C, the SNRtotadc will be much higher than 9 dB, assuming the same bit resolution is used as when s(t) is low. If the resolution is designed for the worst case, then the SNRtotadc will be too good if the SNRin is high. Thus, there is a need to reduce the resolution in order to keep the SNRtotadc constant at a level resulting in an acceptable BER.

In addition, the required resolution for the ADC also depends on various factors other than the SNR, including the input level range, whether or not automatic gain is used in the receiver, the accuracy of the automatic gain (how constant the input level can be kept), the speed of the automatic gain (how well fading is followed), the degree to which the quantization noise deteriorates the total noise factor of the receiver, and the crest factor of the received signal. These factors should also be taken into account.

Similar to the resolution in the ADC, the bit resolution needed for the DAC is determined by various factors, including how much quantization noise can be tolerated, how accurate the modulation has to be (with regard to phase error or error vector magnitude), and the crest factor of the signal to be transmitted.

FIG. 5A illustrates a conventional transmitter which may be included in, for example, a transceiver such as the transceiver 170. The transmitter shown in FIG. 5A includes a Waveform Generator (WFG) 510 and a DAC 520. A digital signal sd(t) having r bits is generated in the WFG 510. This signal is converted into an analog waveform Sc(t) by the DAC 520. The DAC 520 has a signal to noise ratio SNRdac, and the resulting analog signal has a signal to noise ratio SNRtotdac.

The principle for D/A conversion is similar to the principle of A/D conversion. In D/A conversion, a continuous waveform that has an infinite resolution in the amplitude is approximated from a discrete waveform having a finite resolution in the amplitude.

A difference between D/A conversion and A/D conversion is that SNRtotdac only depends on the quantization of the signal. The quantization noise in the transmitter results from quantization in the WFG 510 and the DAC 520. Furthermore, in D/A conversion, the signal to quantize is not approximated as Gaussian. In fact, the amplitude distribution P(x) of the signal to quantize in the DAC are perfectly known by the transmitter.

Equations 3 and 4 are valid for determining the SNRtotdac, substituting SNRtotdac for SNRtotadc and $Dq_{dac}$ for $Dq_{adc}$. The bit resolution in the DAC 520 does not have to be the same as in the WFG 510.

According to Equations 3 and 4, the quantization noise depends on the statistics of the signal.

A signal with a high crest factor requires a larger number of bits compared to a signal with a low crest factor, assuming the quantization noise is kept constant. To see why this is so, it is helpful to refer to FIGS. 5B and 5C which show signals $x_1(t)$ and $x_2(t)$, respectively, with different shapes and crest factors having the same power $\sigma_x^2$. For the signal $x_2(t)$ that has a large crest factor, the quantization must be such that the signal is not clipped. However, most of the time the signal $x_2(t)$ is small. To represent the small part with a given accuracy, a small quantization interval is required. At the same time, the range must be large not to cause clipping. This high range and small quantization interval means that a large bit resolution is required.

The crest factor Fc can be defined as follows:

$$Fc = \frac{A_{peak}}{A_{rms}} = \frac{\max|x(t)|}{\sqrt{\frac{1}{T} \cdot \int_0^T x^2(t)dt}} \quad (6)$$

where T is the period of the transmitted signal, Apeak is the peak amplitude of the transmitted signal, and Arms is the effective value of the amplitude.

The crest factor of a transmitted signal depends on the modulation format. A transmitter in a specific system might operate in different modes, where each mode has a different modulation format. Thus, in some of the modes, the crest factor might be very low, enabling use of a low bit resolution, while in other modes the crest factor might be high, requiring a high bit resolution.

Conventionally, the bit resolution and the quantization levels are set to manage the worst case, even if this case corresponds to a mode that is rarely used in practice.

Table 2 shows examples of different traffic cases requiring different bit resolutions in the transmitter.

TABLE 2

| Mode | Typical case | Crest factor | Required bit resolution |
|------|--------------|--------------|-------------------------|
| 1 | Low speed data (speech) | Low | Low |
| 2 | High speed data (multiple codes used for one user in a CDMA system) | High | High |
| 3 | IQ-multiplexed control and data. Large difference between the power in the I channel compared to the power in the Q channel (due, for example, to varying signalling demand) | High | High |

A high bit resolution consumes current. In order to keep the current consumption as low as possible, it is important to use as low a bit resolution as possible in a transceiver. The current consumption is approximately halved for every bit that the resolution is reduced. In a transceiver where high speed converters are needed, for example a Wideband CDMA (WCDMA) cellular telephone, the converters can be major contributors to the total current consumption. It is therefore important to keep the number of bits used in quantization and in other processing in the transceiver, such as sampling, as low as possible.

SUMMARY

It is therefore an object of the present invention to reduce the current consumption in a transceiver. It is yet another object to reduce the bit resolution in a transceiver. These and other objects are met by a method and apparatus for adaptive bit resolution.

According to one aspect of the invention, a received analog signal is converted to digital form. A selector selects the resolution of the analog-to-digital conversion based on a signal quality. The signal quality may be the signal to noise ratio or the signal to interference ratio. The resolution is selected depending on how much better the received signal quality is than what is needed.

According to another aspect of the invention, a digital signal to be transmitted is converted to analog form. The resolution of the digital-to-analog conversion is selected based on a crest factor of the signal to be transmitted. The crest factor may depend on the modulation format of the signal to be transmitted.

The analog-to-digital conversion may be performed in a receiver, and the digital-to-analog conversion may be performed in a transmitter. The transmitter and the receiver may be separate or included in a transceiver with adaptable bit resolution.

BRIEF DESCRIPTION OF THE DRAWINGS

The features, objects, and advantages of the invention will become apparent by reading this description in conjunction with the accompanying drawings, in which like reference numerals refer to like elements and in which:

FIG. 1A illustrates an exemplary cellular mobile radiotelephone system;

DETAILED DESCRIPTION

While this description is written in the context of cellular communications systems involving portable or mobile radio telephones, it will be understood by those skilled in the art that Applicants' invention may be applied to other communications applications. Moreover, although these exemplary embodiments are described in the context of CDMA systems and techniques, those skilled in the art will likewise appreciate that the invention is applicable to any type of communication system (e.g., TDMA systems).

According to exemplary embodiments of the invention, a transceiver is provided with adaptable bit resolution. For ease of explanation, a receiver and a transmitter are described separately below. However, it should be understood that the receiver and the transmitter can be implemented separately or can be included in a single transceiver with adaptive bit resolution.

Figure 1B:
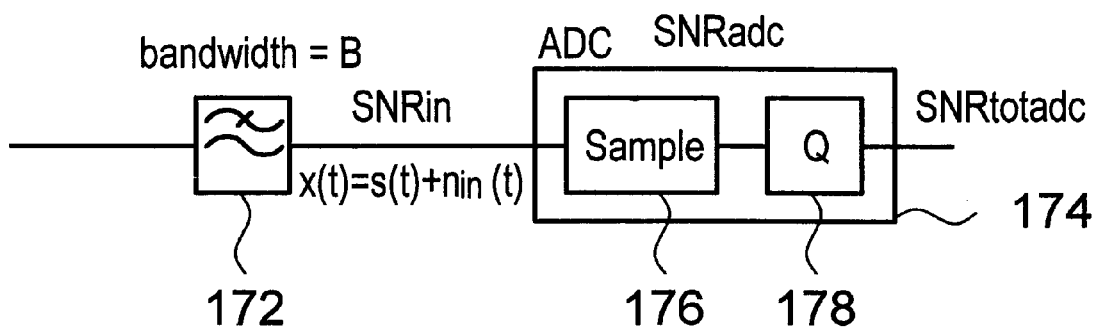
FIG. 1B illustrates a conventional receiver.
Figure 2:
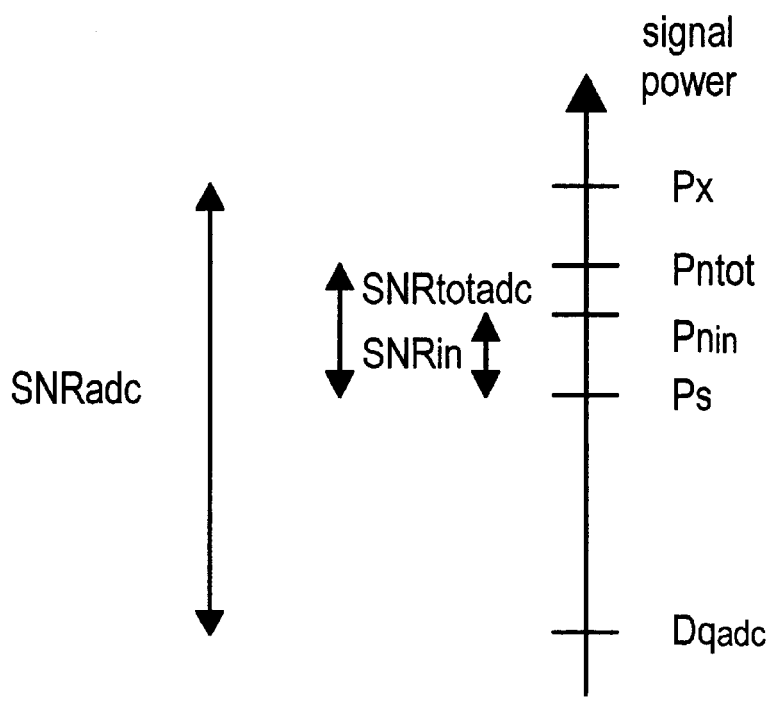
FIG. 2 illustrates signal and noise levels in a receiver.
Figure 3:
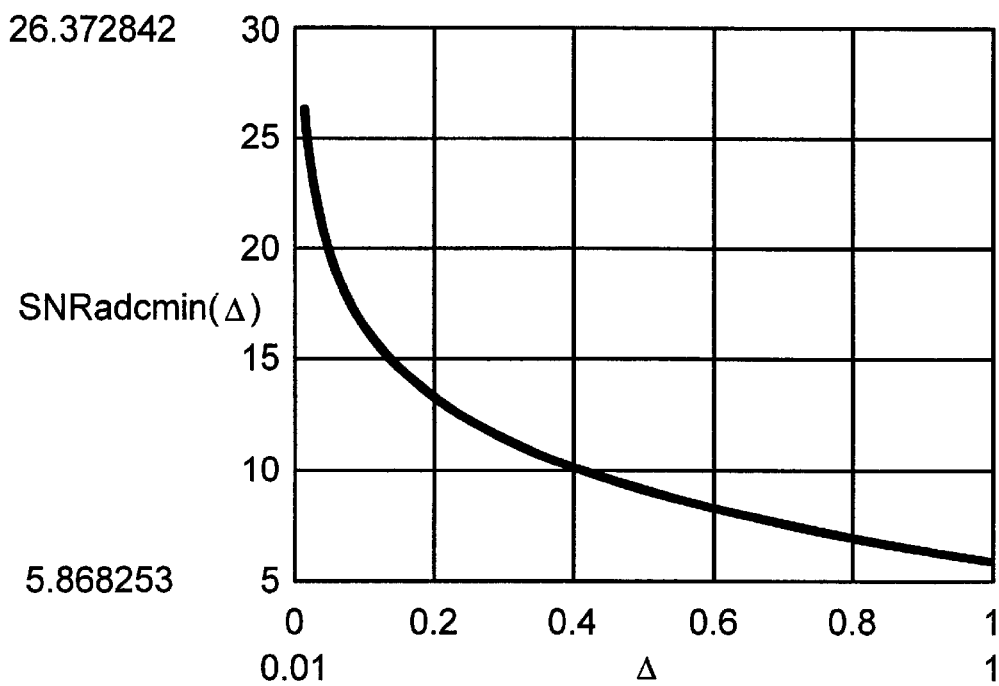
FIG. 3 illustrates a plot of SNRadcmin versus acceptable degradation (Δ) of SNRin.
Figure 4A:
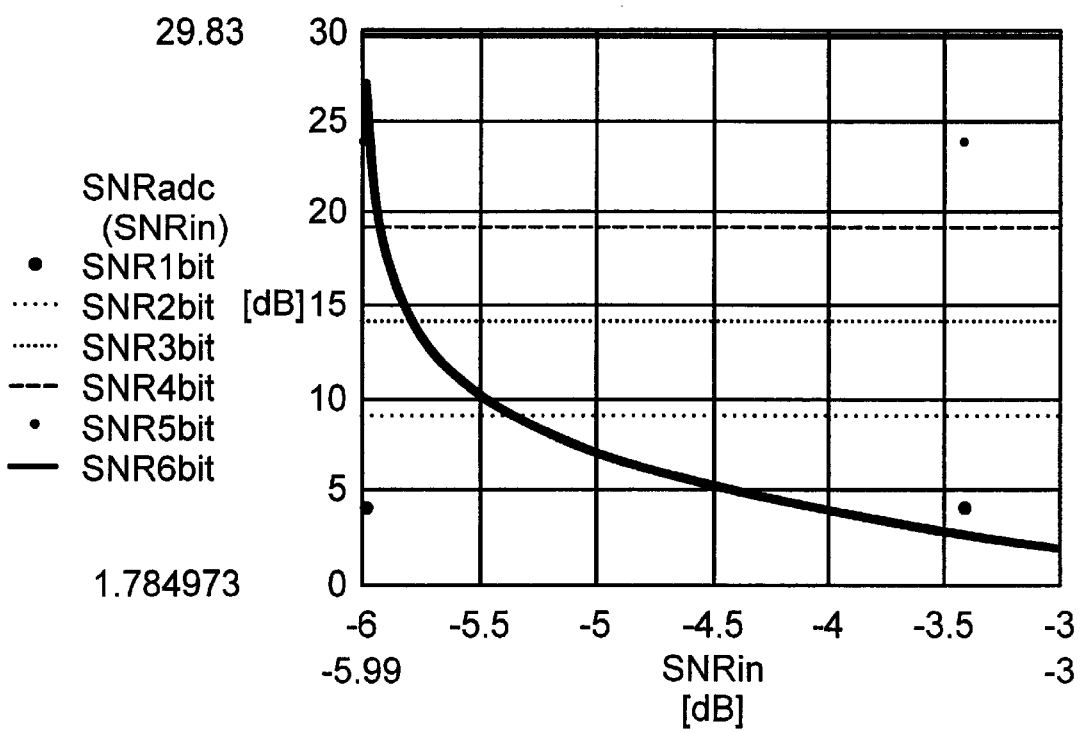
FIG. 4A illustrates a plot of SNRadc versus SNRin for a given SNRtotadc.
Figure 4B:
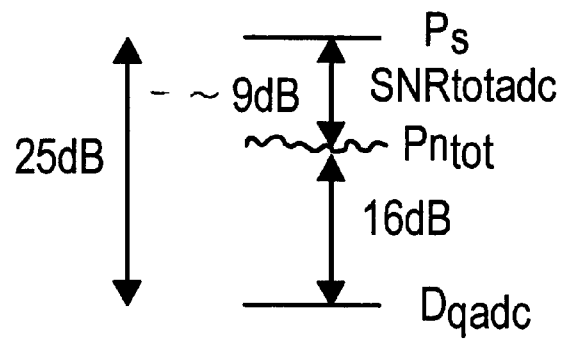
FIGS. 4B and 4C illustrate examples of conventional ADC resolution selection.
Figure 4C:
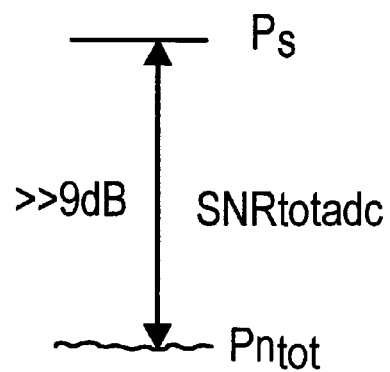
Figure 5A:
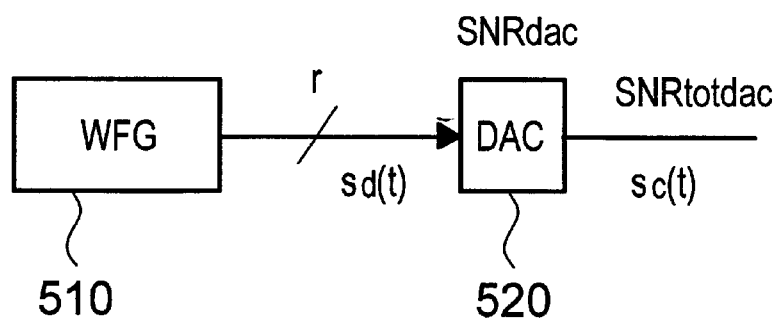
FIG. 5A illustrates a conventional transmitter.
Figure 5B:
FIGS. 5B and 5C illustrate signals having the same power but different shapes and crest factors.
Figure 5C:
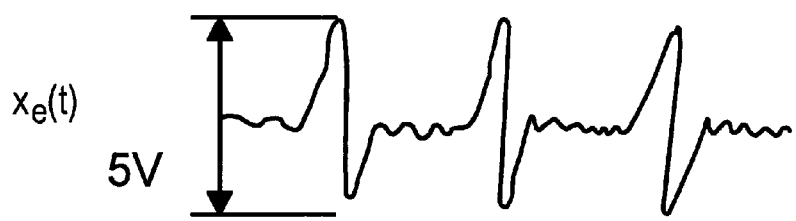
Figure 6A:
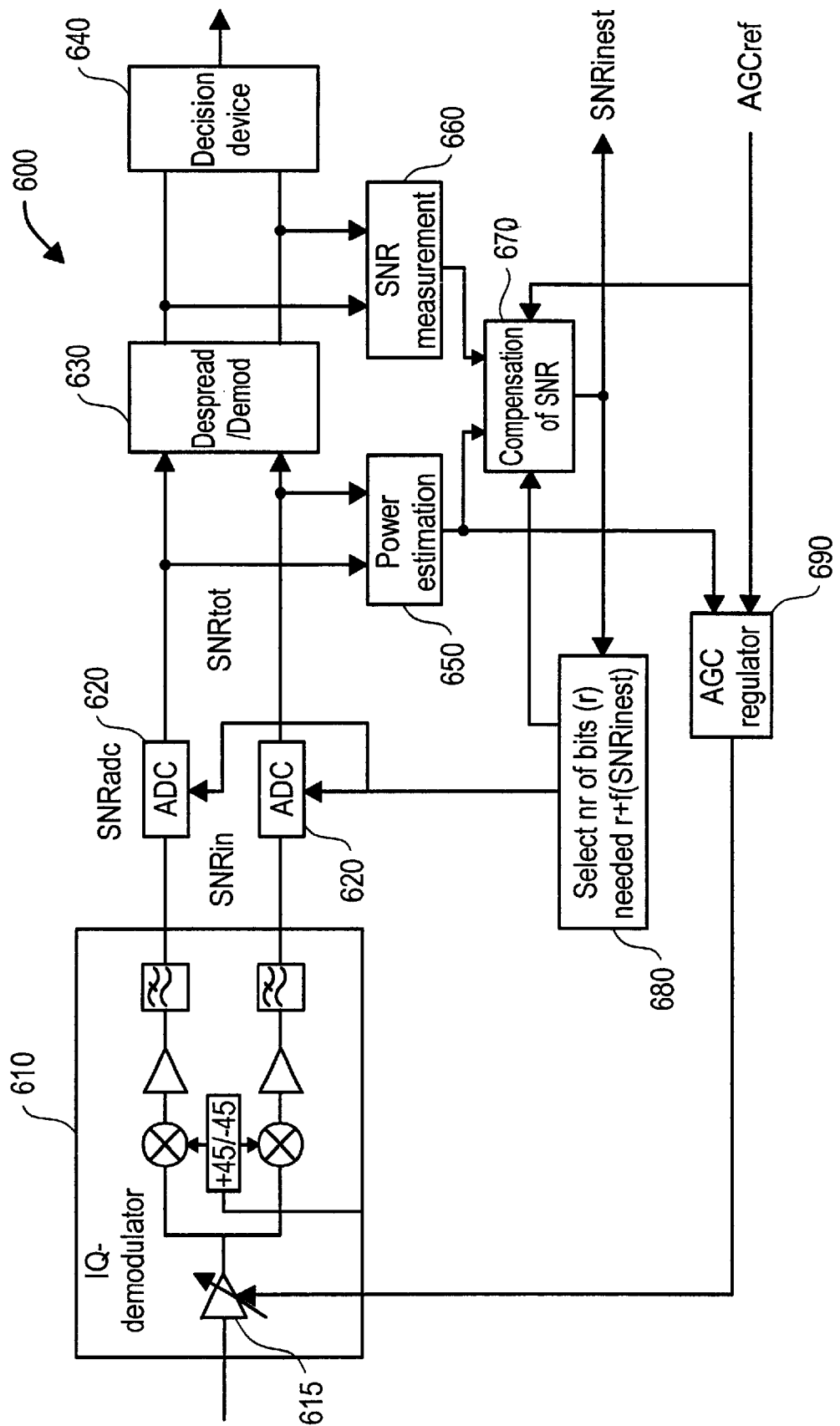
FIG. 6A illustrates an exemplary receiver according to one embodiment the present invention.

According to a first aspect of the invention, a receiver is provided with adaptable bit resolution. FIG. 6A illustrates a block diagram of a receiver 600 according to this aspect of the invention. Received signals are demodulated in a demodulator, e.g., an IQ Demodulator 610 which includes an Automatic Gain Controlled (AGC) amplifier 615. The IQ Demodulator 610 down converts the received analog signal to an appropriate intermediate frequency for further processing and translates it from a polar representation to a Cartesian representation. The signal is then amplified and filtered to extract the desired portion of the received composite signal from energy associated with unwanted parts of the spectrum.

ADC's 620 convert the analog I and Q signals from the IQ Demodulator 610 into digital signals comprising r bits each. The ADC's 620 have a variable resolution, i.e., can be adjusted to output n-bit quantities wherein n can be any number, e.g., 2, 4, 8, 16, 32, etc.

If the receiver is a CDMA receiver, the signal is despread in a Despreader 630 before a pilot based SNR measurement is performed. The Despreader 630 basically multiplies the input signal with a (complex) code and integrates the power over the symbol period.

A Decision Device 640 translates the signals from the Despreader 630 into digital bits, e.g., by combining and decoding the signals, and the signals are transmitted to downstream processing equipment such as a speaker (not shown). If the system is a CDMA system, the Decision Device 640 descrambles the signal.

The signal quality SNRin of the received signal can be expressed as a function of the bit resolution of the ADC's and the subsequent signal processing in the following manner:

$$SNR = \frac{Eb}{No} \cdot \frac{Rb}{B} \quad (7)$$

where Eb/No is the received energy per bit per noise power density, Rb is the bit rate, and B is the noise bandwidth of the receiver. From Equation 7, it can be seen that at good input signal quality, a higher quantization noise, and hence a lower bit resolution, can be tolerated.

According to an exemplary embodiment of the present invention, the resolution used in the ADC's 620 and in the following signal processing can be selected based on the received signal quality, e.g., the SNR or SIR. For a high SNRin, a low bit resolution is sufficient, resulting in low current consumption. Conversely, for a low SNRin, a high bit resolution is needed, resulting in high current consumption.

Table 3 shows an example of how the bit resolution in the ADC can be varied, depending on the quality of the received signal.

TABLE 3

| SNRin-SNRtotadcmin [dB] (how much better than needed is the SNRin) | Number of bits per sample |
|---|---|
| 0.0 | 4 |
| 0.5 | 3 |
| 1.0 | 2 |
| 3.0 | 1 |

Of course, the values given in Table 3 are only examples. In an actual application, the possible bit resolutions may be numerous, extending beyond four bits. Also, the accuracy and speed of the AGC control, as well as channel fading, can be taken into account in selecting a bit resolution.

A Power Estimator 650 estimates the power of the received signal using some suitable algorithm, for example:

$$\sigma_x^2 = i^2 + q^2 \quad (8)$$

where $i^2$ and $q^2$ are the power of the I and Q words, respectively. The estimated power is used by an AGC Regulator 690 to regulate the AGC amplifier 615. The AGC regulator 690 controls the gain of the AGC amplifier 615 in order to keep the signal energy (or the noise of interference energy) constant into the ADC's. The AGC reference gain is set so that optimum quantization is achieved.

It will be appreciated that the AGC receiver in FIG. 6A is only shown as an example. The invention is not limited to applications in only an AGC receiver.

Figure 6B:
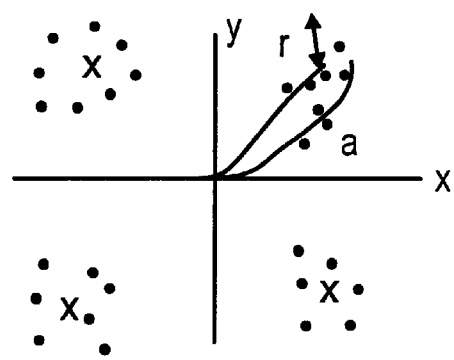
FIG. 6B illustrates how pilot symbol based SNR estimation may be performed.

An SNR measurement circuit 660 estimates the SNRtotadc. The SNR measurement circuit 660 may, for example, be a pilot based SNR measurement circuit which estimates the SNRtotadc based on the known pilot symbols in the transmitted received signal. For example, referring to FIG. 6B, a known pilot symbol sequence is represented as x and the received symbols are represented by "·". The SNRtotadc can be estimated by averaging the square of the distance between x and · for each · and relating this to the length $\alpha$ of the pilot vector. It will be appreciated that the SNRin can be estimated in any other suitable manner.

If the bit resolution is adjusted in the ADC's, then at high SNRin, the ADC quantization noise, $Dq_{adc}$, is not be negligible compared to the input noise. Thus, the quantization noise will deteriorate the SNRin. Consequently, the measured SNRtotadc may have to be compensated to correctly reflect the SNRin. It is important to perform this compensation since a transceiver such as a mobile station typically reports the received SNRin to the base station. Referring again to FIG. 6, this compensation can be performed in a Compensator 670.

The SNR compensation can be performed in two steps. First, the effect of insufficient bit resolution is determined, i.e., SNRadc is estimated. SNRadc can be calculated using Equations 3 and 4. In the simplest case, the input signal is assumed to be Gaussian. Based on this assumption, the SNRadc can be calculated from the estimated signal power $(\sigma_x)^2$ output from the Power-Estimator 650 and the quantization noise of the ADC, $Dq_{adc}$, again using Equations 3 and 4. Second, the SNRin is estimated based on SNRadc and the SNRtotadc, from the pilot based SNR measurement circuit 660, by solving for SNRin in Equation 1.

The Selector 680 selects the number of bits, r, needed to represent the received signal in digital form. The Selector 680 determines how much better the estimated SNRin is than a certain SNRtotadminc. The Selector 680 may comprise a subtractor for this purpose. The number of bits is selected depending on the difference between SNRin and SNRtotadcmin using, for example, the values given in Table 3. These values may be stored, for example, in a look-up table in the Selector 680. For example, if the SNRin is 3 dB better than the needed SNRtotadc for a certain BER, the number of bits selected can be 1. On the other hand, if the SNRin is not any better than the needed SNRtotadc, then the number of bits selected can be 4.

Although a CDMA receiver is shown in FIG. 6A, the invention can be applicable to a non-CDMA receiver by making minor adjustments, e.g., by removing the Despreader block 630 and the descrambling functions from the Decision Device 640.

Figure 7:
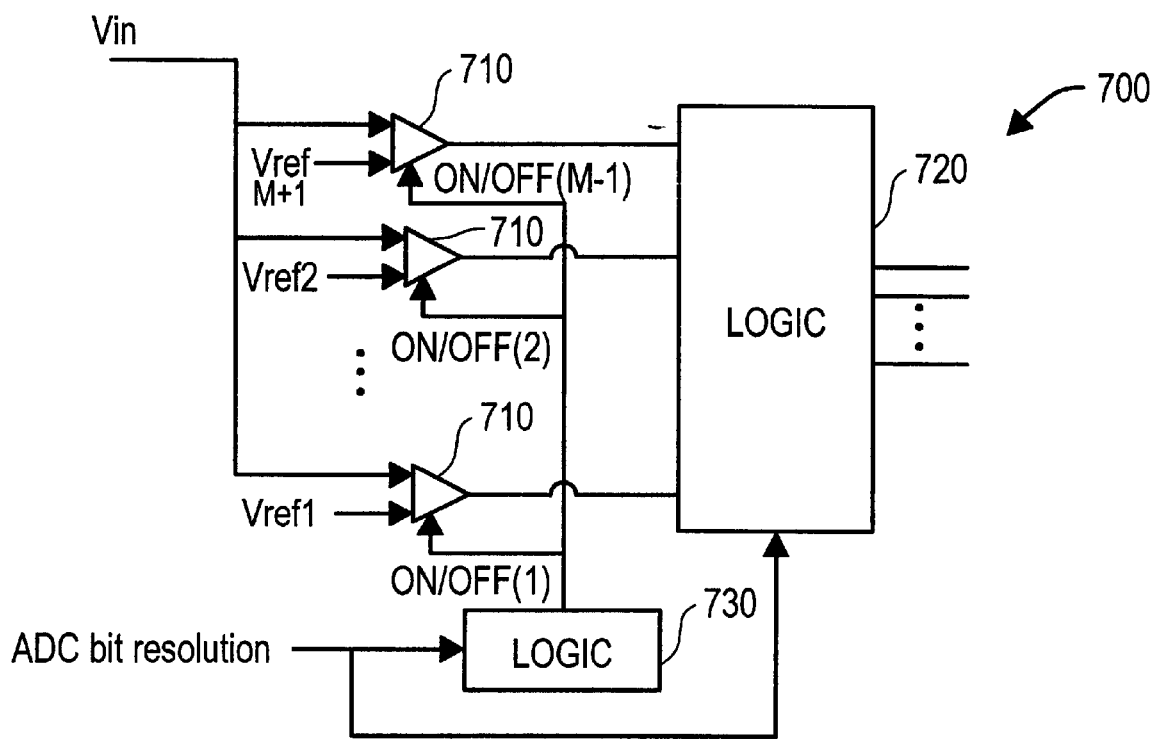
FIG. 7 illustrates an exemplary r-bit FLASH converter with adaptable bit resolution.

Each of the ADC's 620 in FIG. 6A can be implemented with a converter 700 such as that shown in FIG. 7. The converter 700 shown in FIG. 7 is an r-bit FLASH converter with adaptable bit resolution. The converter 700 comprises M−1 comparators 710, where M=$2^r$, and r is the maximum number of bits needed. The reference voltages can be provided by an accurate voltage divider, such as a resistor ladder. The bit resolution is controlled by turning the proper comparators on and off through logic 730. The converter 700 is designed for the maximum needed number of bits, and for each step that the resolution is decreased, one bit is set to zero, starting with the least significant. The logic 720 maps the outputs of the comparators into an output signal, depending on the bit resolution.

Figure 8:
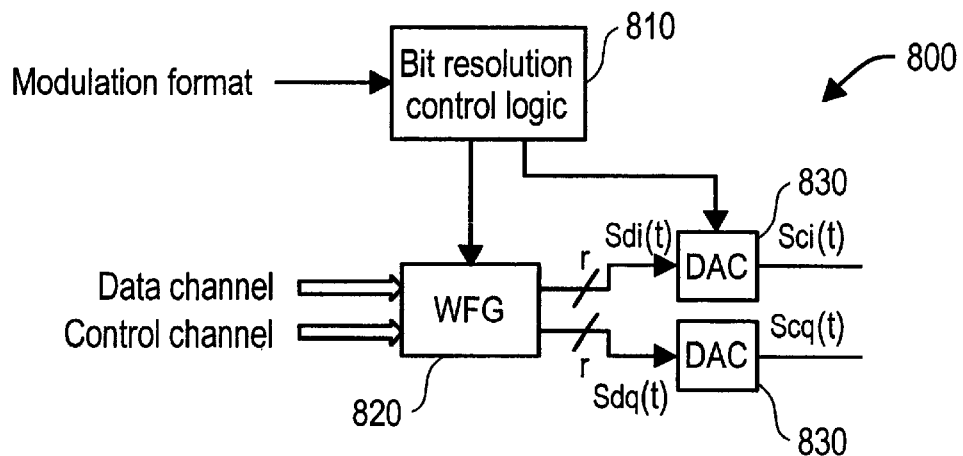
FIG. 8 illustrates a block diagram of a transmitter according to the present invention.

According to another aspect of the invention, a transmitter is provided with adaptable bit resolution. FIG. 8 is a block diagram of a transmitter 800 according to this aspect of the invention. The transmitter comprises bit resolution control logic 810, a Wave Form Generator (WFG) 820, and DAC's 830. The WFG 820 maps the control and data information bits to a specific wave form. The waveform generated depends on the modulation format for the signal to be transmitted. The DAC's 830 convert the digital word sdi(k) or sdq(k) to an analog waveform. The bit resolutions of the WFG 820 and the DAC's 830 are controlled by the bit resolution control logic 810 which adjusts the resolution to use as low a bit resolution as possible. For ease of implementation, the bit resolutions of the WFG 820 and the DAC's 830 can be controlled to be the same. Alternately, the bit resolution of the WFG 820 can be set for the worst case scenario, and the bit resolution for the DAC's 830 can be adapted depending on the modulation format, e.g., depending on the crest factor of the signal to be transmitted. According to an exemplary embodiment, the bit resolution (s) is/are selected by the bit resolution control logic 810.

In the transmitter DAC's 830, for a certain SNR, when the crest factor of the signal to transmit is low, less resolution is needed than when the crest factor is high. The crest factor is known, based on the modulation format used. For example, in a WCDMA system, the crest factor is higher when multiple codes are used in the transmitter than when a single code is used. Multiple codes are used at high user data bitrates (for example, 384 kbps or higher). Thus, for a single code modulation format, low resolution is sufficient, resulting in low current consumption. For a multicode modulation formation, high resolution is needed, resulting in high current consumption. The resultant analog signal can then be output, e.g., to transmit signal processing circuitry (e.g. a QPSK or O-QPSK modulator followed by, possibly, pulse-shaping filters), amplified by a transmit power amplifier (not shown) and ultimately coupled to an antenna (also not shown).

Figure 9:
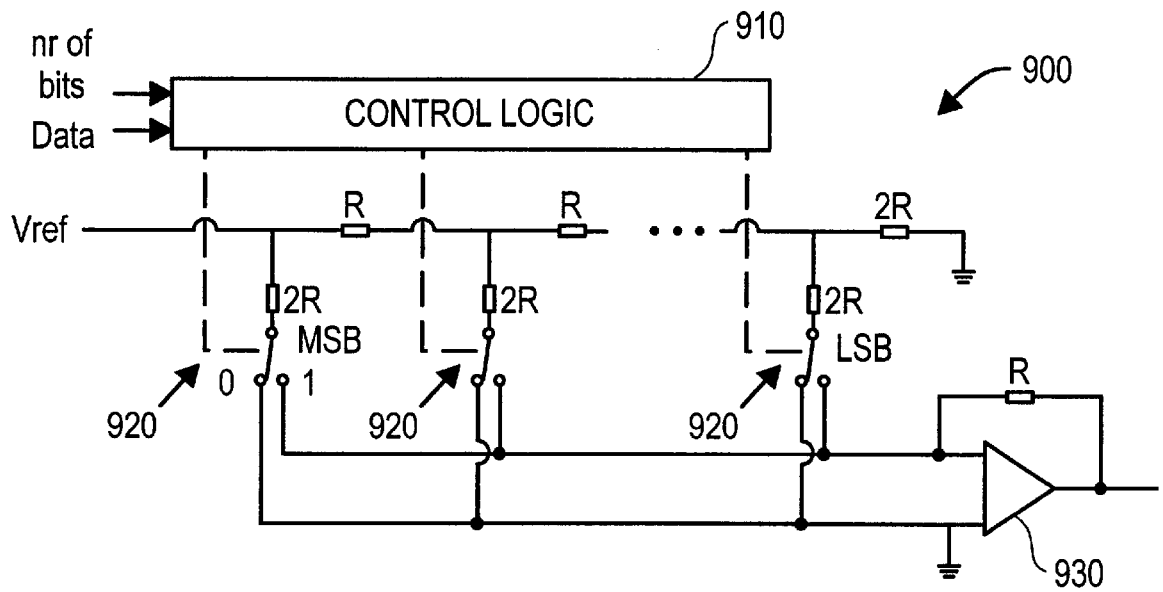
FIG. 9 illustrates an exemplary DAC with adaptable bit resolution.

An example of a DAC with adjustable bit resolution is shown in FIG. 9. The DAC shown in FIG. 9 includes control logic 910 and an R-2R current scaling ladder including switches 920, one for each bit of the word from the most significant bit (MSB) to the least significant bit (LSB). The switches 920 are actuated by the control logic 910 depending on the data in each bit of the binary digital signal. The current output depends on the binary input. For example, a maximum output current occurs when the binary input is all 1's. The output current is converted to an output voltage by an op-amp 930. An example of a DAC of this type is described in Robert B. Northrop, *Analog Electronic Circuits*, Chap. 14.2, pp. 464–469 (1990).

Figure 10A:
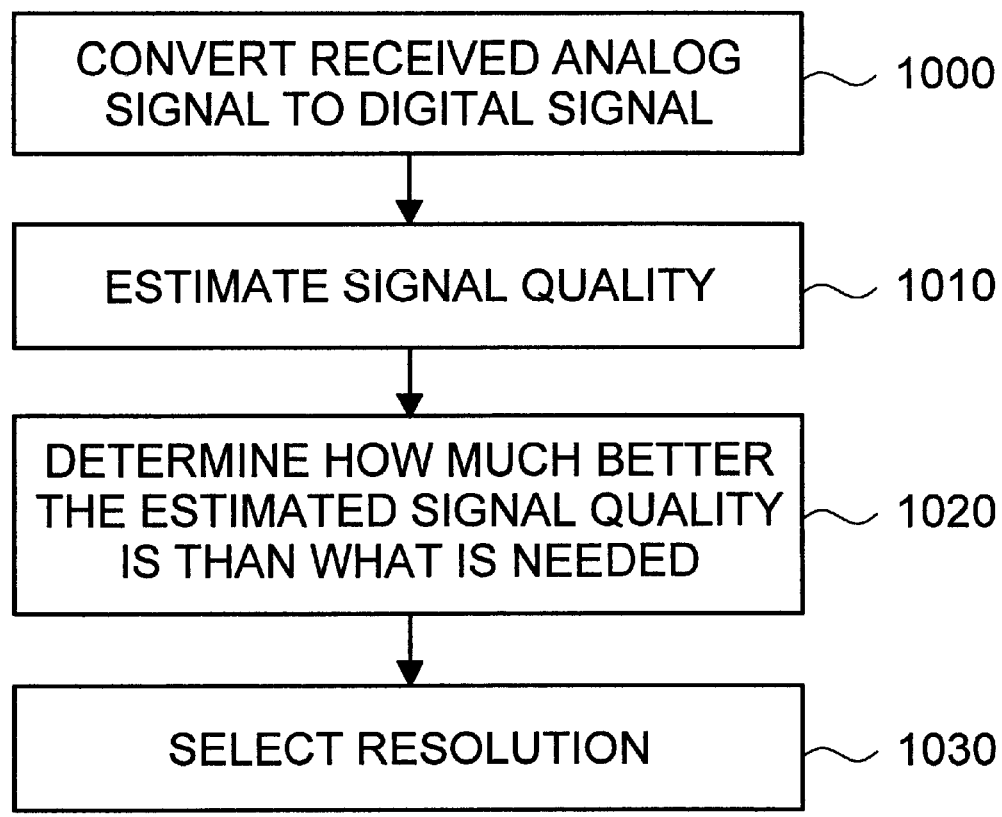
FIGS. 10A and 10B illustrate exemplary methods for adapting bit resolution in a receiver and a transmitter, respectively.
Figure 10B:
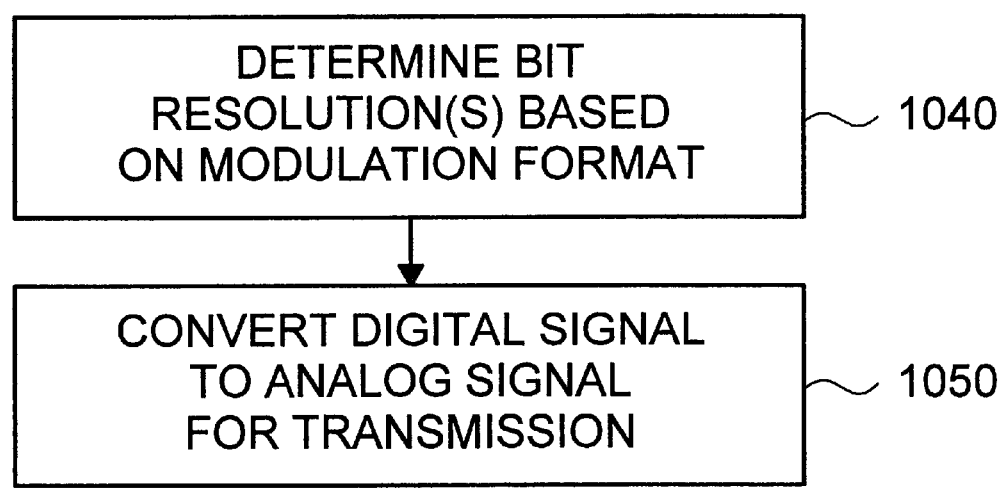

FIGS. 10A and 10B illustrate methods for adapting bit resolution in a receiver and a transmitter, respectively. Referring to FIG. 10A, the method for adapting bit resolution in a receiver begins at step 1000 where the received analog signal is converted to a digital signal in the ADC's 620 shown in FIG. 6. Next, at step 1010, the signal quality, e.g., the SNRin is estimated. The SNRin can be estimated using the Compensation circuit 670 as described above. At step 1020, a determination is made how much better the estimated signal quality is than what is needed, and at step 1030, the bit resolution is selected based on this information.

Steps 1020 and 1030 can be performed in the Selector 680 which determines the difference between the estimated SNRin and the SNRtotadcmin and selects the bit resolution based on this difference.

Referring to FIG. 10B, the method for adapting bit resolution in a transmitter begins at step 1040 at which the bit resolution is selected based on a modulation format, e.g., a crest factor, of the digital signal. This step may be performed in the bit resolution control logic 810 shown in FIG. 8. Then, at step 1050, the digital signal is converted to an analog signal for transmission. This step may be performed in the DAC's 830.

Although described above with reference to particular embodiments, it will be appreciated by those of ordinary skill in the art that this invention can be embodied in other specific forms without departing from its essential character. The embodiments described above should therefore be considered in all respects to be illustrative and not restrictive.

What is claimed is:

1. A receiver comprising:
   an analog-to-digital conversion device for converting a received analog signal into a digital signal; and
   a selector for selecting a resolution of the conversion device, wherein the resolution of the conversion device is selected based on a signal quality of the received signal.

2. The receiver of claim 1, wherein the resolution is selected based on the signal to noise ratio or signal to interference ratio of the received signal.

3. The receiver of claim 1, wherein the resolution of the conversion device is selected depending on how much better the signal quality is than what is needed.

4. A transmitter comprising:
   a digital-to-analog conversion device for converting a digital signal to analog form for transmission; and
   a selector for selecting a resolution of the conversion device, wherein the resolution of the conversion device is selected based on a crest factor of the signal for transmission.

5. The transmitter of claim 4, wherein the crest factor depends on a modulation format of the signal for transmission.

6. The transmitter of claim 4, wherein the higher the crest factor, the higher the resolution selected.

7. A transceiver comprising:
   an analog-to-digital conversion device for converting a received analog signal into a digital signal;
   a digital-to-analog conversion device for converting a digital signal to analog form for transmission; and
   a selector for selecting resolutions of the conversion devices, wherein the resolution of the analog-to-digital conversion device is selected based on a signal quality of the received signal, and the resolution of the digital-to-analog conversion device is selected based on a crest factor of the signal for transmission.

8. The transceiver of claim 7, wherein the resolution of the analog-to-digital conversion device is selected based on the signal to noise ratio or signal to interference ratio of the received signal, and the crest factor is selected depending on the modulation format.

9. The transceiver of claim 7, wherein the resolution of the analog-to-digital, conversion device is selected depending on how much better the signal quality than what is needed, and the higher the crest factor, the higher the selected resolution of the digital-to-analog converter.

10. A method of adapting bit resolution in a receiver, comprising the steps of:

selecting a resolution of an analog-to-digital conversion device based on a signal quality of a received analog signal; and converting the received analog signal into a digital signal in the analog-to-digitat conversion device, wherein the resolution is selected based on the signal to noise ratio or signal to interference ratio of the received signal.

11. A method of adapting bit resolution in a receiver, comprising the steps of:

selecting a resolution of an analog-to-digital conversion device based on a signal quality of a received analog signal; and converting the received analog signal into a digital signal in the analog-to-digital conversion device, wherein the resolution is selected depending on how much better the received signal quality is than what is needed.

12. A method of adapting bit resolution in a digital transmitter, comprising the steps of:

selecting a resolution of a digital-to-analog conversion device based on a crest factor of a digital signal for transmission; and converting the digital signal into an analog signal for transmission in the digital-to-analog conversion device.

13. The method of claim 12, wherein the crest factor depends on a modulation format of the signal for transmission.

14. The method of claim 12, wherein the higher the crest factor, the higher the resolution selected.

15. A method of adapting bit resolution in a digital transceiver, comprising the steps of:

selecting a resolution of an analog-to-digital conversion device based on a signal quality of a received analog signal;

converting the received analog signal into a digital signal in the analog-to-digital conversion device;

selecting a resolution of a digital-to-analog conversion device based on a crest factor of a digital signal for transmission; and converting the digital signal into an analog signal for transmission in the digital-to-analog conversion device.

16. The method of claim 15, wherein the resolution of the analog-to-digital conversion device is selected based on the signal to noise ratio or signal to interference ratio of the received signal, and the crest factor depends on the modulation format.

17. The method of claim 15 wherein the resolution of the analog-to-digital conversion device is selected depending on how much better the received signal quality is than what is needed, and the higher the crest factor, the higher the selected resolution of the digital-to-analog conversion device.

* * * * *